US011916116B2

(12) United States Patent
Aoki (10) Patent No.: US 11,916,116 B2
(45) Date of Patent: Feb. 27, 2024

(54) SEMICONDUCTOR DEVICE (71) Applicant: SANKEN ELECTRIC CO., LTD., Niiza (JP)

(72) Inventor: Hironori Aoki, Niiza (JP)

(73) Assignee: SANKEN ELECTRIC CO., LTD., Niiza (JP)

(*) Notice: Subject to any disclaimer, the term of this patent is extended or adjusted under 35 U.S.C. 154(b) by 105 days.

(21) Appl. No.: 17/709,735

(22) Filed: Mar. 31, 2022

(65) Prior Publication Data

US 2023/0238434 A1 Jul. 27, 2023

(30) Foreign Application Priority Data

Jan. 25, 2022 (JP) .................................. 2022-009416

(51) Int. Cl.
*H01L 29/40* (2006.01)
*H01L 29/78* (2006.01)
*H01L 29/06* (2006.01)

(52) U.S. Cl.
CPC .......... *H01L 29/402* (2013.01); *H01L 29/063* (2013.01); *H01L 29/7823* (2013.01)

(58) Field of Classification Search
CPC . H01L 29/402; H01L 29/7823; H01L 27/088; H01L 29/0619; H01L 29/0653; H01L 29/0692; H01L 29/0696; H01L 29/0878; H01L 29/404; H01L 29/407; H01L 29/66681–66704; H01L 29/7816–7826; H01L 21/761; H01L 29/063–0634

See application file for complete search history.

(56) References Cited

U.S. PATENT DOCUMENTS

| | | | |
|---|---|---|---|
| 9,373,619 B2 * | 6/2016 | Su | H01L 29/404 |
| 2010/0052049 A1 * | 3/2010 | Lotfi | H01L 27/0922 257/334 |
| 2014/0264585 A1 * | 9/2014 | Moon | H01L 29/7823 438/286 |
| 2015/0221720 A1 * | 8/2015 | Mallikarjunaswamy | H01L 29/0619 257/495 |

FOREIGN PATENT DOCUMENTS

| | | |
|---|---|---|
| JP | H09-283716 A | 10/1997 |
| JP | 2004-349296 A | 12/2004 |
| JP | 2018-117069 A | 7/2018 |
| JP | 2018-195640 A | 12/2018 |
| WO | 2018/051412 A1 | 3/2018 |

* cited by examiner

*Primary Examiner* — Shahed Ahmed
(74) *Attorney, Agent, or Firm* — METROLEX IP LAW GROUP, PLLC (57) ABSTRACT

A semiconductor device according to one or more embodiments may include: on a semiconductor substrate, a high voltage circuit region; a transistor element region; an isolation region that elementally isolates the transistor element region from the high voltage circuit region; and a capacitively coupled field plate including plural lines of conductors, wherein the capacitively coupled field plate is provided to extend circumferentially along an outer circumferential portion of the high voltage circuit region and across the transistor element region, in a plan view of the semiconductor device, and one or more dividing sections divides at least one of the plural lines of conductors in the capacitively coupled field plate to make the at least one line discontinuous.

12 Claims, 9 Drawing Sheets

SEMICONDUCTOR DEVICE

CROSS REFERENCE TO RELATED APPLICATIONS

This application claims priority based on 35 USC 119 from prior Japanese Patent Application No. 2022-009416 filed on Jan. 25, 2022, entitled "SEMICONDUCTOR DEVICE", the entire contents of which are incorporated herein by reference.

BACKGROUND

The disclosure may relate to a semiconductor device including a high voltage circuit region, a transistor element region, an isolation region that elementally isolates the transistor element region from the high voltage circuit region, and a capacitively coupled field plate including plural lines of conductors.

A power device such as an IGBT, a MOSFET, or the like is used in an inverter for motor control, as well as an inverter for a home appliance such as a power supply application for a plasma display panel (PDP), a liquid crystal panel, an air conditioner, and lighting, and in many fields. In recent years, with advances in LSI (Large Scale Integrated Circuit) technology, high withstand voltage semiconductor devices (high withstand voltage ICs) up to 1200V class have been put into practical use for AC400 type industrial power supplies, etc.

A high voltage integrated circuit (HVIC) is used, which is a high withstand voltage gate driver IC that incorporates, into one chip, a low-side drive circuit, a high-side drive circuit, and a level shift circuit that performs level-up and level-down functions for control signals.

SUMMARY

An aspect of the disclosure may be a semiconductor device that includes: on a semiconductor substrate, a high voltage circuit region; a transistor element region; an isolation region that elementally isolates the transistor element region from the high voltage circuit region; and a capacitively coupled field plate including plural lines of conductors, wherein the capacitively coupled field plate is provided to extend circumferentially along an outer circumferential portion of the high voltage circuit region and across the transistor element region, in a plan view of the semiconductor device, and one or more dividing sections divides at least one of the plural lines of conductors in the capacitively coupled field plate to make the at least one line discontinuous.

According to the above aspect, even if the potentials of the high voltage circuit region and the transistor element region which are opposed to each other across the isolation region are different from each other, a potential fluctuation on a surface of the isolation region can be reduced. In addition, according to the above aspect, leakage current from the high voltage circuit region to the transistor element region and the isolation region can be suppressed due to parasitic transistors in the high voltage circuit region, the isolation region, and the transistor element region.

Note that the one or more dividing sections may be arranged on a side of the high voltage circuit region with respect to the isolation region, in the plan view of the semiconductor device.

Such a configuration allows more effective suppression of the leakage current from the high voltage circuit region to the isolation region and the transistor element region due to the parasitic transistors.

Note that the one or more dividing sections may be arranged on a side of the transistor element region with respect to the isolation region, in the plan view of the semiconductor device.

Such a configuration allows more effective suppression of the leakage current from the high voltage circuit region to the isolation region and the transistor element region due to the parasitic transistors. Further, in such a configuration, the conductor is extended from the high voltage circuit region side onto the isolation region, and thus it is possible to suppress affects on the ON resistance of elements in the transistor element region even if charge is injected into the conductor on the isolation region.

Note that the capacitively coupled field plate may include: at least one of the plural lines of conductors including a first dividing section of the one or more diving sections that is disposed on a side of the high voltage circuit region with respect to the isolation region in the plan view of the semiconductor device; and at least one of the plural lines of conductors including a second dividing section of the one or more dividing sections that is disposed on a side of the transistor element region with respect to the isolation region in the plan view of the semiconductor device.

Such a configuration allows more effective suppression of the leakage current from the high voltage circuit region to the isolation region and the transistor element region due to the parasitic transistors. Further, in such a configuration, the conductor is extended from the high voltage circuit region side onto the isolation region, and thus it is possible to suppress affects on the ON resistance of elements in the transistor element region even if charge is injected into the conductor on the isolation region.

Note that the one or more dividing sections may be arranged to overlap with the isolation region in the plan view of the semiconductor device.

Such a configuration allows more effective suppression of the leakage current from the high voltage circuit region to the isolation region and the transistor element region due to the parasitic transistors.

Note that the semiconductor device may be equipped with a shield electrode disposed above the one or more dividing sections.

Such a configuration can suppress the influence of external ions.

Note that the capacitively coupled field plate may be configured such that all of the plural lines of conductors include the one or more dividing sections.

Such a configuration can suppress the leakage current more effectively.

Note that the RESURF region may be located around the high voltage circuit region in the plan view of the semiconductor device.

The above aspect is particularly effective in the semiconductor device including such a RESURF region.

Note that the RESURF region may not be located in an area between the high voltage circuit region and the transistor element region, in the plan view of the semiconductor device.

Even in the semiconductor device having such a configuration, the effect of suppressing the leakage current from the high voltage circuit region can be obtained.

Note that the semiconductor device may be configured such that a width of each of the one or more dividing sections is be equal to or less than a width of the isolation region in the plan view of the semiconductor device.

With such a configuration, the effect of the field plate and the effect of suppressing the leakage current can be stably obtained.

Note that the semiconductor device may further include a low voltage circuit region.

The above aspect is particularly effective in the semiconductor device having such a low voltage circuit region.

Note that the semiconductor device may be configured such that the semiconductor substrate has a first conductivity type, the high voltage circuit region is located within a first semiconductor region of a second conductivity type on the semiconductor substrate, the transistor element region includes: a high voltage side main electrode on a second semiconductor region of the second conductivity type that is separated from the first semiconductor region on the semiconductor substrate; a low voltage side main electrode; and a control electrode provided between the high voltage side main electrode and the low voltage side main electrode, the isolation region is a semiconductor region of the first conductivity type, the capacitively coupled field plate includes: a first conductor group overlapping with a part of the outer edge of the high voltage circuit region in the plan view of the semiconductor device and including plural lines of conductors being separated from and capacitively coupled to each other; and a second conductor group arranged between the control electrode and the high voltage side main electrode of the transistor element region and including plural lines of conductors being separated from and capacitively coupled to each other, one end of the first conductor group is electrically connected to the first semiconductor region, the other end of the first conductor group is electrically connected to the third semiconductor region of the first conductive type, which is electrically connected to the semiconductor substrate, one end of the second conductor group is electrically connected to the high voltage side main electrode, the other end of the second conductor group is electrically connected to the control electrode or the low voltage side main electrode, and the one or more dividing sections divides one or more of the plural conductor lines of the first conductor group and one or more of the plural conductor lines of the second conductor group that are adjacent to the one or more of the plural conductor lines of the first conductor group.

Such a configuration suppresses the inversion of the conductivity type on the surface of the isolation region, thereby suppressing the leakage current from the high voltage circuit region to the isolation region and the transistor element region.

As described above, the semiconductor device according to the aspect can reduce the potential fluctuation in the isolation region when the potential of the first semiconductor region in the high voltage circuit region becomes different from that of the second semiconductor region in the transistor element region. In addition, the leakage current from the high voltage circuit region to the isolation region and the transistor element region can be suppressed.

DETAILED DESCRIPTION

Related Art

Figure 19:
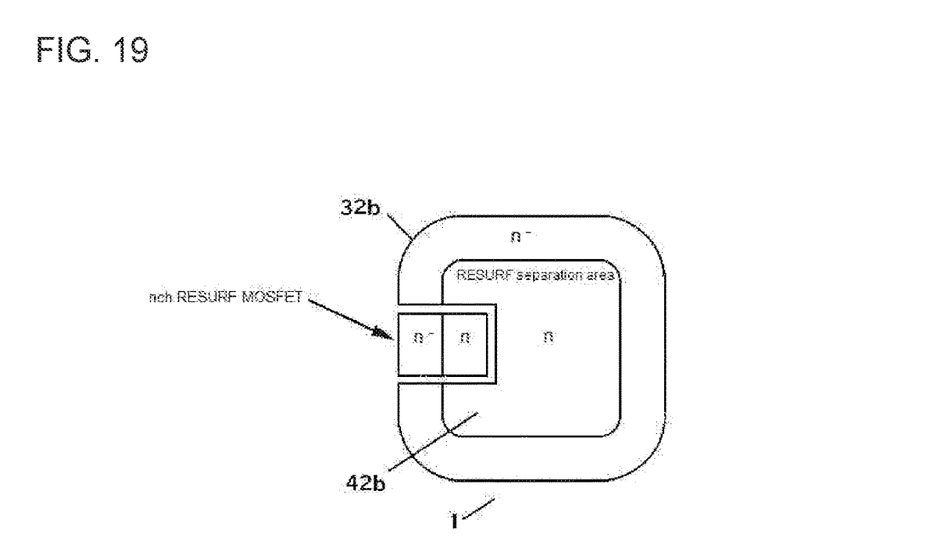
FIG. 19 is a diagram illustrating a plan view of a level shift device of a general HVIC.

First, related art is described below. FIG. 19 is a plan view of a semiconductor region of a semiconductor device disclosed in FIG. 1 of Patent Document 1 (Japanese Patent Application Publication No. H09-329994), illustrating a level shift device of a general HVIC. As illustrated in FIG. 19, a high voltage circuit region (a high-side drive circuit) is provided in a first semiconductor region (an N diffusion region 42b) whose an outer periphery is surrounded by a high withstand voltage isolation region 32b.

There is known an HVIC having a structure in which a high voltage circuit region on which a high potential side circuit 110 illustrated in FIG. 18 (described later) or the like are equipped, a high withstand voltage LDMOSFET (Laterally Diffused Metal-Oxide-Semiconductor Field-Effect Transistor, hereinafter, may be simply referred to as a high withstand voltage LDMOS) of the level shift circuit corresponding to HVNMOS 101 and 102 illustrated in FIG. 18 (described later) and the like are formed on a same semiconductor substrate. In such an HVIC, a high withstand voltage isolation region disclosed in Patent Document 1 or Patent Document 2 (International Patent Application Publication No. 2018/051412) is formed as a RESURF (Reduced Surface Field) isolation structure. In addition, a first semiconductor region in the high withstand voltage isolation region and a second semiconductor region for the high withstand voltage LDMOS are also electrically separated from each other by an isolation region composed of a trench isolation such as an annular trench disclosed in Patent Document 3 and a trench isolation structure disclosed in Patent Document 4, or a PN junction isolation such as a P-slit region disclosed in Patent Document 5 or Patent Document 1.

Patent Document 1: Japanese Patent Application Publication No. H09-283716
Patent Document 2: International Patent Application Publication No. 2018/051412
Patent Document 3: Japanese Patent Application Publication No. 2018-195640
Patent Document 4: Japanese Patent Application Publication No. 2004-349296
Patent Document 5: Japanese Patent Application Publication No. 2018-117069

Figure 18:
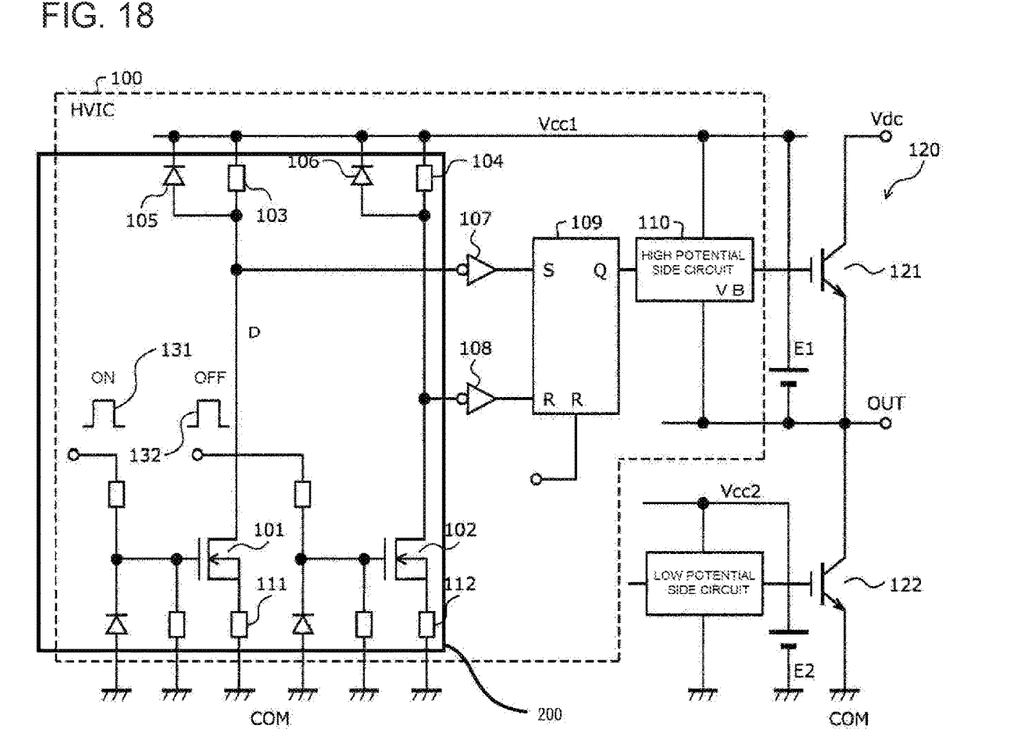
FIG. 18 is a diagram illustrating a circuit configuration of a general HVIC with a built-in level shift device.

FIG. 18 illustrates a circuit configuration of a general HVIC including a built-in level shift device disclosed in FIG. 5 of Patent Document 5 (JP2018-117069). The HVIC 100 illustrated in FIG. 18 is a gate driver IC that drives one (IGBT 121) of IGBTs 121 and 122 that is provided at a high potential side (an upper arm) that forms, for example, one phase of a bridge circuit 120. The bridge circuit 120 is connected in series between a positive electrode potential (a power supply potential) Vdc of a main DC power supply and a negative electrode potential (a common potential) COM.

The reference numeral OUT in FIG. 18 indicates an AC output terminal of the bridge circuit 120, which is a connection point between an emitter of the IGBT 121 on the upper arm of the bridge circuit 120 and a collector of the IGBT 122 on the low potential side (a lower arm) of the bridge circuit 120. The HVNMOS (high withstand voltage n-channel MOSFET (Metal Oxide Semiconductor Field Effect Transistor)) 101 and 102, load resistors 103 and 104, and constant voltage diodes 105 and 106 of a level shift device 200, NOT circuits 107 and 108, an RS flip flop (RS-FF) 109, a high potential side circuit 110, and an auxiliary DC power supply E1 constitute the level shift circuit for driving the IGBT 121 of the upper arm of the bridge circuit 120. The reference numeral Vcc1 in FIG. 18 indicates a potential of a cathode terminal, which is, a potential of a positive electrode line of the auxiliary DC power supply E1 on the high potential side (the highest potential of the HVIC).

The HVNMOS 101 conducts when an ON signal 131 of the pulse created by the control circuit (not illustrated) is input, and the IGBT 121 is turned on in response to a voltage drop of the load resistance 103 due to the conduction of the HVNMOS 101 as a signal. The HVNMOS 102 conducts when an OFF signal 132 of the pulse created by the control circuit is input, and the IGBT 121 is turned off in response to a voltage drop of the load resistor 104 due to the conduction of the HVNMOS 102 as a signal. The control circuit is supplied with a current from the potential Vcc2 of the positive electrode line of the auxiliary DC power supply E2 on the low voltage side with respect to the common potential COM.

Of the level shift circuit, the two HVNMOS 101 and 102 are circuit portions for inputting a signal based on the common potential COM to the subsequent stage (NOT circuits 107 and 108). The HVNMOS 101 and the HVNMOS 102 are usually configured equal to each other and the load resistor 103 and the load resistor 104 are usually configured equal to each other. The HVNMOS 101 and 102 have a source follower configuration in which resistors 111 and 112 for current negative feedback are connected between the common potential COM and the sources of the HVNMOS 101 and 102, respectively.

A predetermined withstand voltage (for example, 30 V) may be required between the first semiconductor region, which is the N-type diffusion layer in the high voltage circuit region, and the second semiconductor region, which is the N-type diffusion layer in the transistor element region, and it may be required that no leak current flows between the high voltage circuit region and the transistor element region. In a high withstand voltage isolation structure between the high voltage circuit region and the transistor element region, for example, a capacitively coupled field plate (MFFP: Multiple Floating Field Plate) may be employed that includes a conductor electrically connected to the first semiconductor region and a conductor electrically connected to the second semiconductor. In a case where such a technology is applied to the HVIC described in FIG. 19, etc. and, for example, the potential of the high voltage circuit region opposed to the isolation region is higher than the potential of the transistor element region opposed to the isolation region (hereinafter, may be referred to as "the potentials of the high voltage circuit region and the transistor element region which are opposed to each other across the isolation region are different from each other"), the potential of the isolation region under the field plate may fluctuate due to the potential change of the field plate. In addition, the phenomenon of inversion of the conductivity type on the surface of the isolation region may occur, and thus a leak path of the inversion layer may be generated on the surface of the isolation region that isolates the high voltage circuit region from the high withstand voltage LDMOS (the transistor element region). One or more embodiments of the disclosure may solve such a problem.

Embodiments

Descriptions are provided hereinbelow for one or more embodiments. However, the invention is not limited to the following one or more embodiments.

Figure 5:
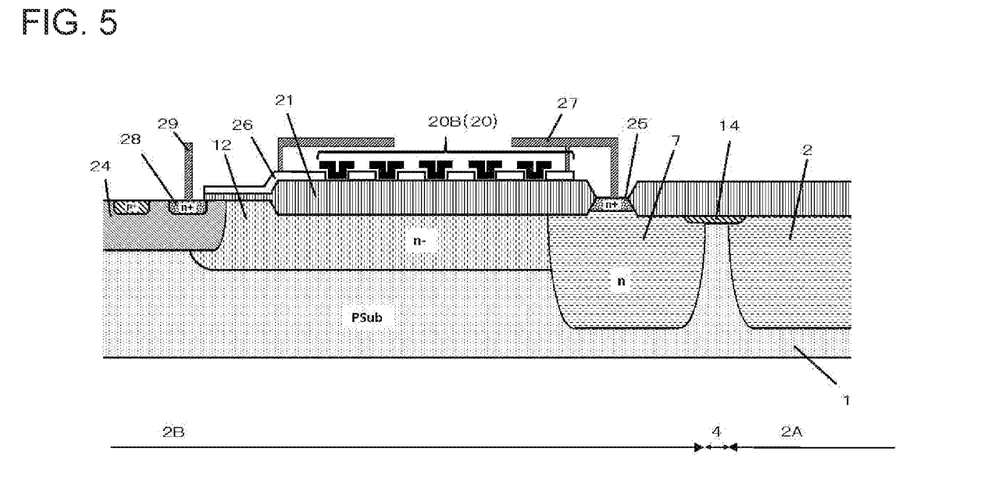
FIG. 5 is a diagram illustrating a sectional view of the semiconductor device 10, taken along D-D in FIG. 1.
Figure 7:
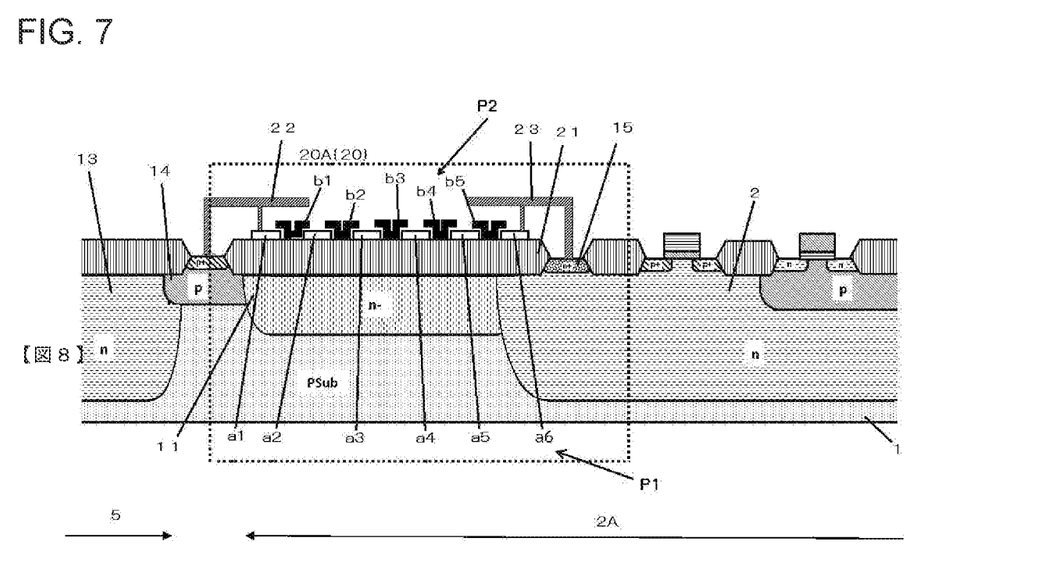
FIG. 7 is a diagram illustrating a cross sectional view of the semiconductor device 10, with reference numerals for each conductor of a section 20A of a field plate 20 being added to the sectional view illustrated in FIG. 2.
Figure 8:
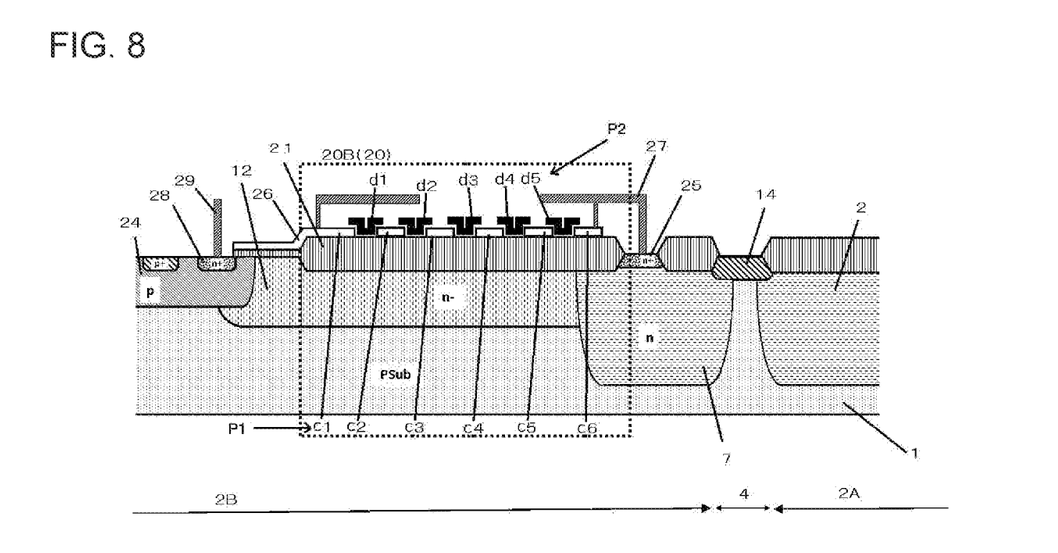
FIG. 8 is a diagram illustrating a cross sectional view of the semiconductor device 10, with reference numerals for each conductor of a section 20B of the field plate 20 being added to the sectional view illustrated in FIG. 5.

A semiconductor device 10 according to an embodiment includes, in a plan view of the semiconductor device 10 (see FIG. 1), notched portions recessed from an outer circumference of a high voltage circuit region 2A, and transistor element regions (LDMOS) 2B partially provided in the notched portions of the voltage circuit region 2A. In the plan view of the semiconductor device 10 (see FIG. 1), the semiconductor device 10 further includes: a RESURF region 11 that is provided in an outer circumferential portion of the high voltage circuit region 2A and circumferentially extends along the outer circumference of the high voltage circuit region 2A; and a RESURF region 12 that is provided between a control electrode 26 and a high voltage side main electrode 27 of each of the transistor element regions (LDMOS) 2B. In the plan view of the semiconductor device 10 (see FIG. 1), a capacitively coupled field plate 20 is provided to extend circumferentially along the RESURF region 11 of the high voltage circuit region 2A through the RESURF regions 12 of the transistor element regions (LDMOS) 2B. In other words, as illustrated in FIGS. 2 and 7, the capacitively coupled field plate 20 is provided on the RESURF region 11 provided in the outer circumferential portion of the high voltage circuit region 2A, and as illustrated in FIGS. 5 and 8, the capacitively coupled field plate 20 is provided, on the RESURF region 12, between the control electrode 26 and the high voltage side main electrode 27 of the transistor element region 2B. The capacitively coupled field plate 20 includes plural lines (plural strips) of conductors which are capacitively coupled to one another. As illustrated in FIGS. 1, 2, 3, and 7, the RESURF region 11 is provided at the outer circumferential portion of the high voltage circuit region 2A. Each conductor in the field plate 20 affects the surface potential of the RESURF region 11 immediately below the conductor, thereby causing a depletion layer to extend further outward within the RESURF region 11 in the plan view of the semiconductor device 10. As a result, the withstand voltage of the semiconductor device 10 is ensured. Note that although the device illustrated in FIG. 1 includes the two transistor element regions (LDMOS) 2B separated from each other to left and right sides, the device may include only one transistor element region. Because the field plate 20 includes a conductor connected to the high voltage circuit region 2A and a conductor electrically connected to the transistor element region (LDMOS) 2B, when the high voltage circuit region 2A and the transistor element region (LDMOS) 2B have different potentials so that the potential of the high voltage circuit region 2A is higher (for example, +15V) than that of the transistor element region (LDMOS) 2B, the potentials of the other conductors of the capacitively coupled field plate 20 also rises to a certain potential due to capacitive coupling under the influence of the different potentials. In response to the raised potentials of the other conductors, the potential of the surface of the P-type semiconductor layer in the isolation region 4 under the other conductors of the field plate also rises (Note that the surface of the P-type semiconductor layer may include the surface of the semiconductor layer of the same conductive type as and electrically connected to a P-type semiconductor substrate 1 (the first conductive type semiconductor region) or the P-type semiconductor substrate 1, if there is such a surface). This may cause leakage current from the high voltage circuit region 2A to the isolation region 4 and the transistor element regions 2B.

Thus, it may be preferable that the semiconductor device can suppress the leakage current from the high voltage circuit region to the isolation region and the transistor element region.

The inventor of this application has studied the above identified problem intensively, and has developed semiconductor devices according to one or more embodiments. A semiconductor device according to an embodiment may include: on a semiconductor substrate, a high voltage circuit region; a transistor element region; an isolation region that elementally isolates the transistor element region from the high voltage circuit region; and a capacitively coupled field plate including plural lines of conductors, wherein the capacitively coupled field plate is provided to extend circumferentially along an outer circumferential portion of the high voltage circuit region and across the transistor element region in the plan view of the semiconductor device, and one or more dividing sections divides at least one of the plural lines of conductors in the capacitively coupled field plate to make the at least one line discontinuous. With this configuration, it is possible to suppress leakage current from the high voltage circuit region to the isolation region and the transistor element region.

One or more embodiments are explained in more detail below with referring to drawings. In the respective drawings referenced herein, the same constitutions are designated by the same reference numerals and duplicate explanation concerning the same constitutions is basically omitted. All of the drawings are provided to illustrate the respective examples only. In the following description, the expressions such as "provided on", "disposed on", or the like include a case where they are provided in contact with each other, a case where they are placed with another layer or other layers therebetween, and the like.

(Semiconductor Device)

Figure 1:
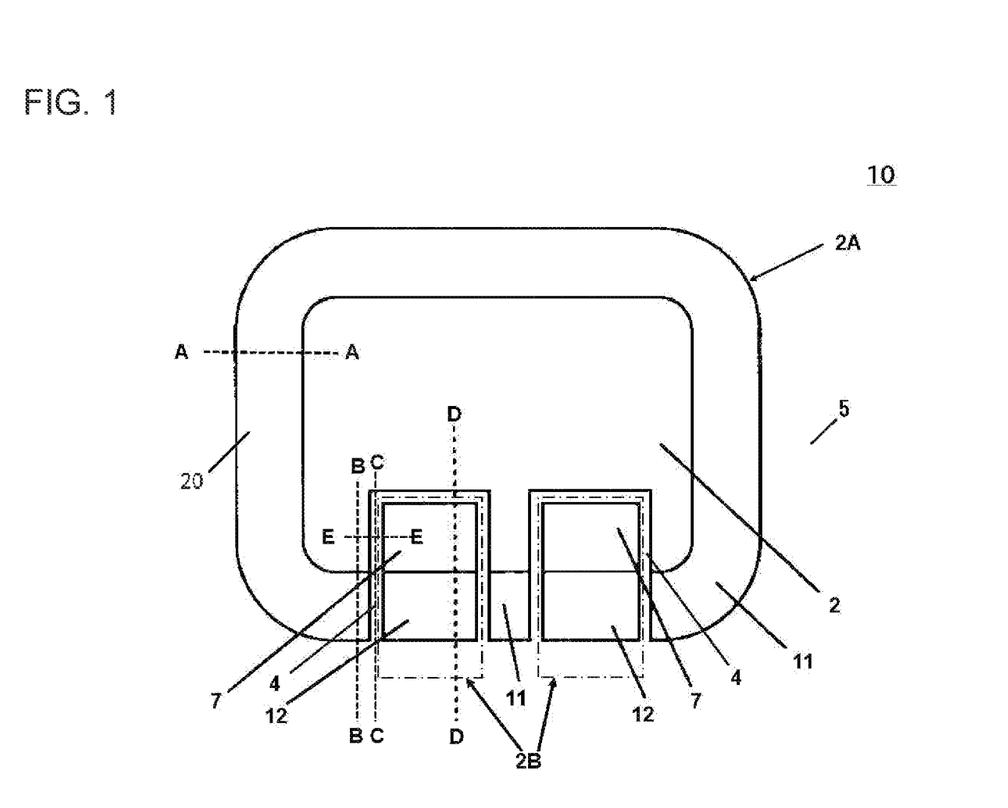
FIG. 1 is a diagram illustrating a plan view of a semiconductor device 10 according to a first embodiment of the disclosure.
Figure 2:
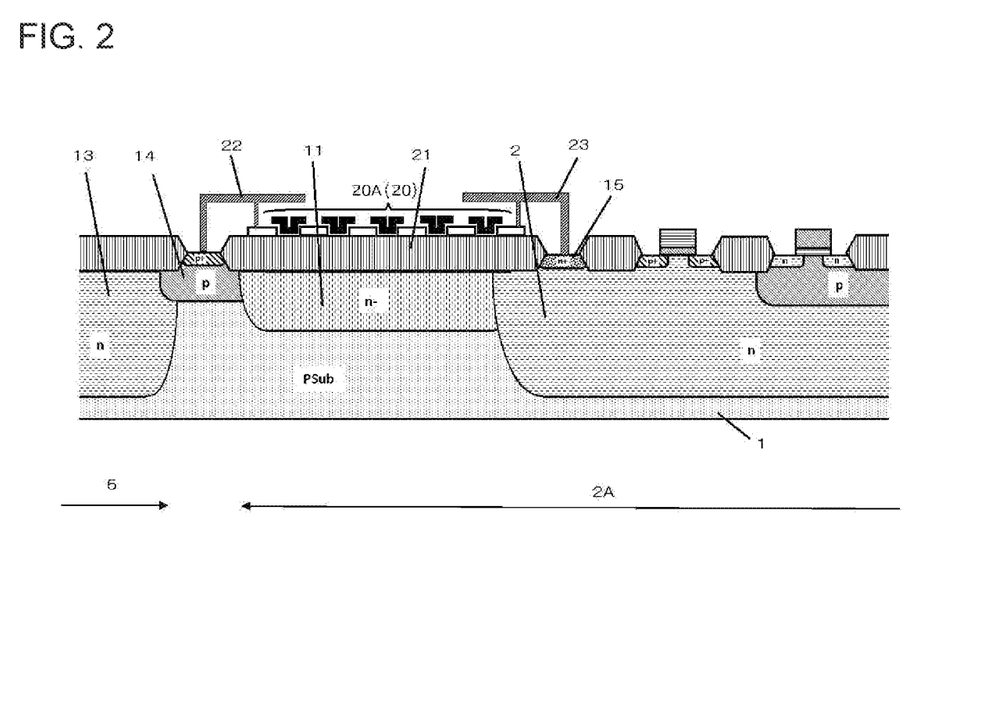
FIG. 2 is a diagram illustrating a sectional view of the semiconductor device 10, taken along A-A in FIG. 1.

As illustrated in FIG. 1, which is the plan view of the semiconductor device 10, the semiconductor device 10 according to a first embodiment includes, on a semiconductor substrate of a first conductivity type (in this case, P type), the high voltage circuit region (HVDi) 2A, the transistor element regions (LDMOS) 2B, and isolation regions 4 that elementally separate the transistor element regions (LDMOS) 2B from the high voltage circuit region (HVDi) 2A. The semiconductor device 10 further includes the capacitively coupled field plate 20 including the plural lines (plural strips) of conductors capacitively coupled to each other, as illustrated in FIGS. 2 and 4 to 8. In the example illustrated in FIGS. 2 and 4 to 8, the capacitively coupled field plate 20 is composed of two layers of conductor groups provided at different heights from each other, but may be composed of conductor groups provided at approximately the same height, as long as a conductor group(s) is composed of at least one layer. In the example illustrated in FIG. 1, a low voltage circuit region 5 is formed around the high voltage circuit region (HVDi) 2A and the transistor element regions (LDMOS) 2B.

Figure 3:
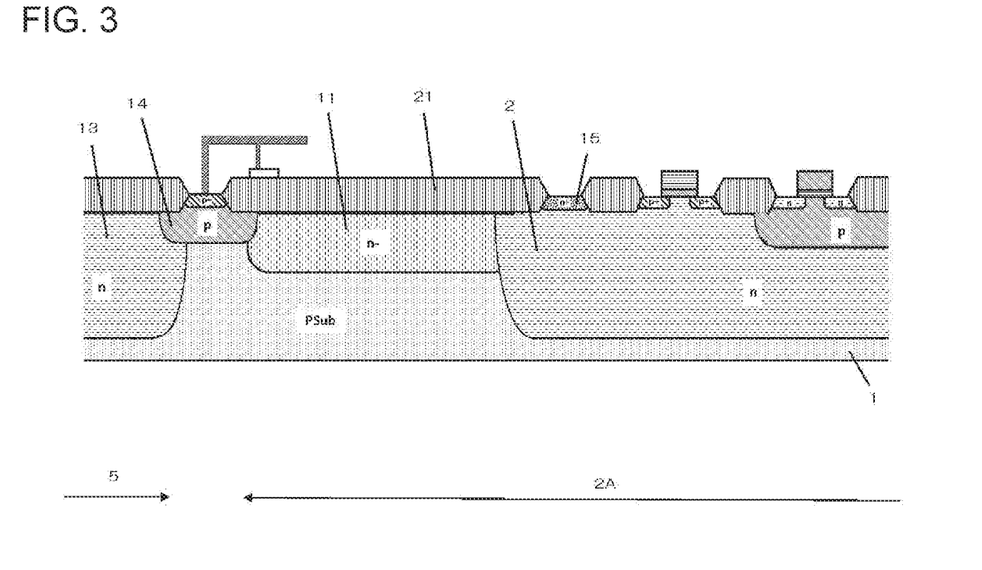
FIG. 3 is a diagram illustrating a sectional view of the semiconductor device 10, taken along B-B in FIG. 1.
Figure 4:
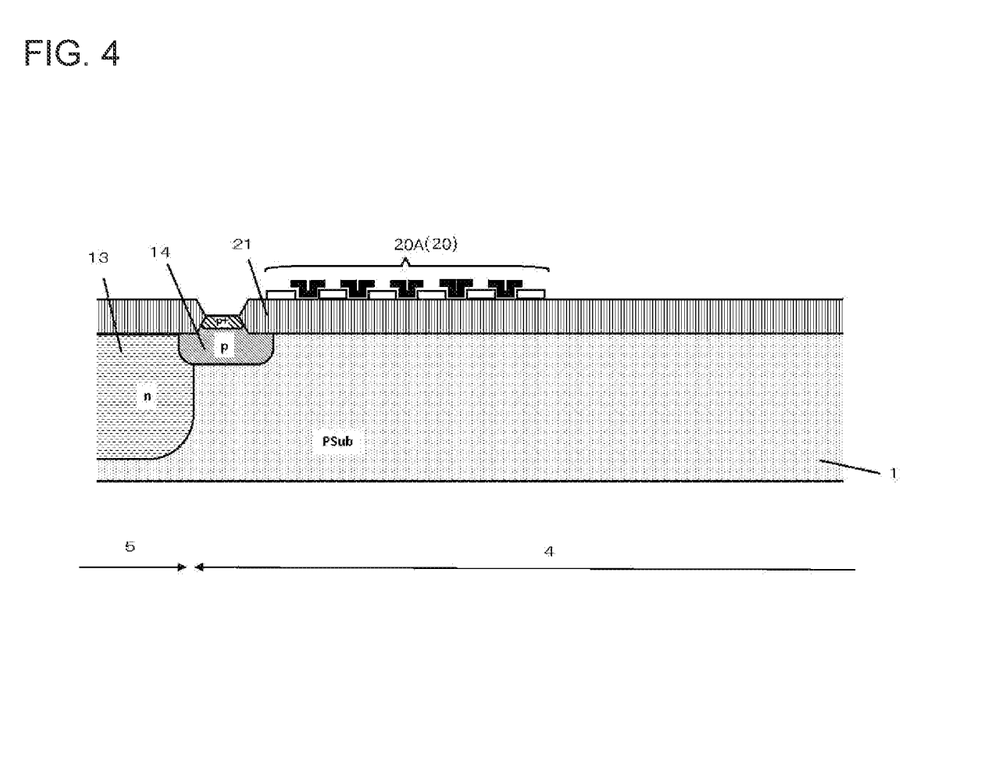
FIG. 4 is a diagram illustrating a sectional view of the semiconductor device 10, taken along C-C in FIG. 1.
Figure 6:
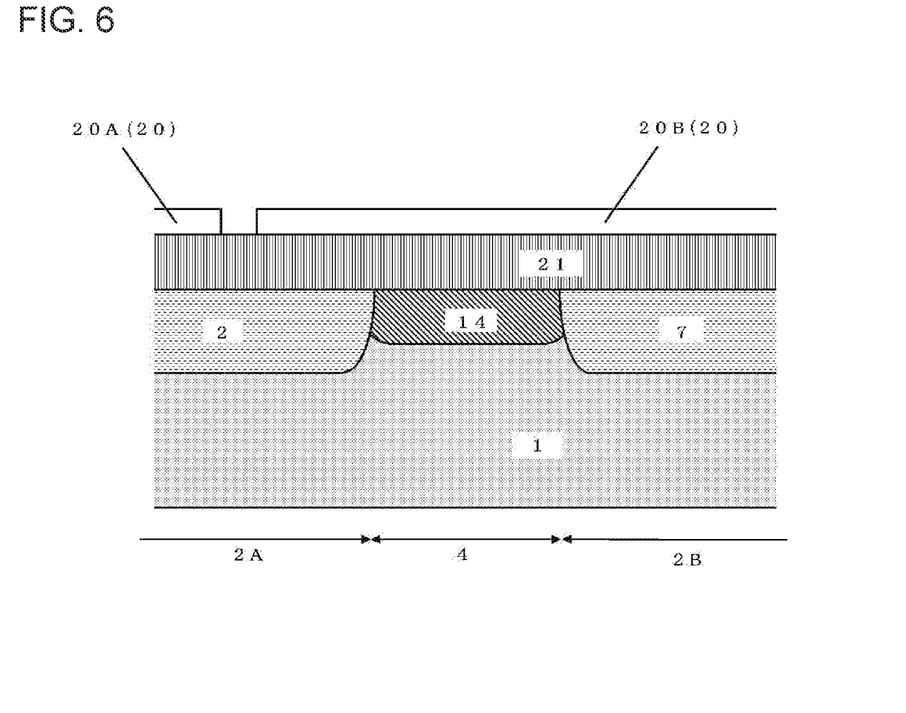
FIG. 6 is a diagram illustrating a sectional view of the semiconductor device 10, taken along E-E in FIG. 1.

Note that FIG. 2 is a cross-sectional view along the A-A line in FIG. 1, illustrating a cross section of an area from the high voltage circuit region (HVDi) 2A through the RESURF region 11 to the low voltage circuit region 5. FIG. 3 is a cross sectional view along the B-B line in FIG. 1, illustrating a cross section (corresponding to the B-B cross section of FIG. 9) extending through a dividing section 6, which breaks up the conductors of the capacitively coupled field plate 20 and makes the conductors discontinuous. FIG. 4 is a cross sectional view along the C-C line in FIG. 1, illustrating a cross section extending along the isolation region 4 that elementally isolates the high voltage circuit region 2A from the transistor element region (LDMOS) 2B. FIG. 5 is a cross sectional view along the D-D line in FIG. 1, illustrating a cross section extending through the high voltage circuit region 2A, the transistor element regions (LDMOS) 2B, and the isolation region 4 that elementally isolates the high voltage circuit region 2A and the transistor element region (LDMOS) 2B. FIG. 6 is a cross sectional view along the E-E line in FIG. 1, illustrating a cross section extending through the high voltage circuit region 2A, the transistor element regions (LDMOS) 2B, and the isolation region 4 that elementally isolates the high voltage circuit region 2A and the transistor element region (LDMOS) 2B. FIG. 7 is a diagram illustrating a cross sectional view of the semiconductor device 10, with reference numerals for each conductor of the capacitively coupled field plate 20 (20A) being added to the sectional view illustrated in FIG. 2. FIG. 8 is a diagram illustrating a cross-sectional view of the semiconductor device 10, with reference numerals for each conductor of the capacitively coupled field plate 20 (20B) being added to the sectional view illustrated in FIG. 5. FIGS. 2 to 17 are views focusing on an area from a periphery of a left side of the left notched portion of the high voltage circuit region (HVDi) 2A to a vicinity of a left side of the left transistor element region (LDMOS) 2B partially provided in the left notched portion, in the plan view of the semiconductor device of FIG. 1. A dividing section same as or similar to the dividing section disclosed in any one of FIGS. 2 to 17 may be provided at a vicinity of a right side of the left transistor element region (LDMOS) 2B partially provided in the left notched portion of the high voltage circuit region (HVDi) 2A. In addition, a dividing section same as or similar to the dividing section disclosed in any one of FIGS. 2 to 17 may be provided at a vicinity of a left side and/or a right side of the right transistor element region (LDMOS) 2B partially provided in the right notched portion of the high voltage circuit region (HVDi) 2A. In other words, a dividing section that breaks up the conductors of the capacitively coupled field plate may be provided at each of four locations above and near the isolation region 4.

(Semiconductor Substrate)

In the semiconductor device according to one or more embodiments, each element, region, etc. constituting the semiconductor device described below is formed on the semiconductor substrate 1. A known substrate can be used as the semiconductor substrate 1, and the type of the substrate is not particularly limited. In the following description, it is assumed that the semiconductor substrate 1 has a first conductivity type. Here, the first conductive type will be described as a P type, but the invention is not limited thereto.

(High Voltage Circuit Region)

Each element in the high voltage circuit region 2A is located in a first semiconductor region 2 having a second conductivity type (N-type) on the semiconductor substrate 1 having the first conductivity type (P-type). Specifically, a deep N-type diffusion layer is formed in P-type semiconductor substrate 1 by diffusion, and each element in the high voltage circuit region 2A is arranged on the N-type diffusion layer. As elements in the high voltage circuit region 2A, a PMOSFET (PMOS), a NMOSFET (NMOS), and etc. are formed. In an outer circumferential portion of the high voltage circuit region (on a side of the low voltage circuit region 5 described below), for example, the RESURF region 11 having a shallow N-type diffusion layer is provided. The RESURF region 11 has a lower impurity concentration than that of the first semiconductor region 2. This so-called RESURF technique allows the depletion layer that extends from the low voltage circuit region 5 side to spread more easily within the RESURF region 11, achieving a high withstand voltage. The capacitively coupled field plate 20 (a large part of a section 20A of the capacitively coupled field plate 20 on the high voltage circuit 2A side with respect to the dividing section 6) is provided on the RESURF region 11 with an insulating film 21 therebetween.

(Transistor Element Region)

A high voltage side main electrode 27 of the transistor element region (LDMOS) 2B is provided on a second semiconductor region 7 of the second conductive type (N type) separated from the first semiconductor region 2 on the semiconductor substrate 1. A fourth semiconductor region 28 of the second conductive type (N type) is provided on a third semiconductor region 24 of the first conductive type (P type) that forms a channel region. The control electrode 26 is provided on the third semiconductor region 24 that serves as the channel region. The transistor element region (LDMOS) 2B includes a low voltage side main electrode 29 electrically connected to the fourth semiconductor region 28, and the high voltage side main electrode 27 electrically connected to the second semiconductor region 7. A semiconductor region 25 is a high voltage side contact region of the second conductivity type (N-type) for obtaining good electrical connection with the high voltage side main electrode 27. The semiconductor region 25 may not be provided. The control electrode 26 is formed, via an insulating film, on the third semiconductor region 24 of the first conductivity type (P-type) formed on the semiconductor substrate 1. Between the second semiconductor region 7 and the third semiconductor region 24, for example, a RESURF region 12 formed of a N-type diffusion layer is formed. The capacitively coupled field plate 20 (a large part of a section 20B of the capacitively coupled field plate 20 on the transistor element region 2B side with respect to the dividing section 6) is provided on the RESURF region 12 with the insulating film 21 therebetween.

(Isolation Region)

The isolation region 4 is an area that elementally isolates the transistor element regions (LDMOS) 2B and the high voltage circuit region 2A from each other. In the following description, the isolation region 4 is a semiconductor region of the first conductivity type (P-type) between the first semiconductor region 2 and the second semiconductor region 7. As illustrated in FIG. 6, the transistor element regions (LDMOS) 2B and the high voltage circuit region 2A are formed of N-type semiconductors, while the isolation region 4 is formed of a P-type semiconductor, and therefore there are PN junctions therebetween to separate from each other. That is, in an embodiment, the isolation region 4 is formed to separate the first semiconductor region 2 in the high voltage circuit region 2A and the second semiconductor region 7 of the transistor element region (LDMOS) 2B from each other by PN junction isolation. A desired withstand voltage (for example, 30 V) is secured by such an isolation region 4. Note that the concentration of the dopant in the isolation region 4 is selected such that, when a high voltage is applied, the dopant is completely depleted between the first semiconductor region 2 on the high voltage circuit region 2A side and the second semiconductor region 7 on the transistor element region (LDMOS) 2B side and the desired withstand voltage is ensured. In FIG. 2 and the like, a first conductive type (P type) semiconductor region 14 having a higher impurity concentration than the semiconductor substrate 1 is provided on the P type semiconductor substrate 1. However, the first conductive type semiconductor region 14 may not be provided.

The isolation region 4 is not particularly limited as long as the transistor element region (LDMOS) 2B and the high voltage circuit region 2A can be separated from each other. It is preferable that the isolation by the isolation region 4 is formed as the PN junction isolation, but the isolation by the isolation region 4 may be formed as isolation in which an insulator (or dielectric) is embedded, isolation by a trench, or the like.

(Capacitively Coupled Field Plate)

As illustrated in FIGS. 2, 4-8, etc., the capacitively coupled field plate 20 (20A, 20B) includes: a first conductor group including plural lines (plural strips) of conductors which are spaced apart from each other and capacitively coupled to each other, the first conductor group being overlapped with the a part of an outer edge of the high voltage circuit region 2A in the plan view of the semiconductor device; and a second conductor group including plural lines of conductors which are spaced apart from each other and capacitively coupled to each other, the second conductor group being provided between the control electrode 26 and the high voltage side main electrode 27 of the transistor element region (LDMOS) 2B. In other words, the filed plate is formed by using a technique of two-layered floating plate having the two conductor groups arranged in the thickness direction of the semiconductor device. Note that the A-A cross section of FIG. 1 is illustrated in FIG. 2. In an example illustrated in FIG. 7, a conductor a6, which is one end of the first group of conductors a1, a2, a3, a4, a5, and a6, is electrically connected to the first semiconductor region 2 and a conductor a1, which is the other end of the first group of conductors a1, a2, a3, a4, a5, and a6, is electrically connected to the semiconductor substrate 1. A conductor c6, which is one end of the second group of conductors c1, c2, c3, c4, c5, and c6, is electrically connected to the high voltage side main electrode 27, and a conductor c1, which is the other end of the second group of conductors c1, c2, c3, c4, c5, and c6, is electrically connected to the control electrode 26 or the low voltage side main electrode 29.

In a case where such plural lines of conductors surround the high voltage circuit region 2A, the capacitance on the high potential side (the capacitance between the conductors a6 and b5 in FIG. 7) is smaller than the capacitance on the low potential side (the capacitance between the conductors a1 and b1 in FIG. 7). The voltage between the conductors (the capacitor voltage) is inversely proportional to capacitance. Therefore, in order to increase the capacitance on the low-potential side, the structure may be designed such that the facing area between the conductors on the high-potential side (e.g., the facing area between the conductors a6 and b5) is larger than the facing area between the conductors on the low-potential side (e.g., the facing area between the conductors a1 and b1). Conversely, the structure may be designed such that the facing area between the conductors on the high potential side is smaller than the facing area between the conductors on the low potential side, so as to bear the potential on the high voltage circuit region 2A.

The semiconductor device that includes the capacitively coupled field plate 20 (20A, 20B) employing such a two-layer floating plate technique can more effectively stabilize the surface potentials of the RESURF regions 11 and 12 due the two-layered capacitively coupled field plate 20 (20A, 20B) and further includes the dividing section 6 that can suppress leakage current between the high voltage circuit region 2A and the transistor element region 2B, so as to make the semiconductor device more reliable.

The capacitively coupled field plate 20 (20A, 20B) includes the plural conductor lines (plural conductor strips) which circumferentially extend along the outer circumferential portion of the high voltage circuit region 2A (see FIG. 2) across the transistor element regions (LDMOS) 2B (see FIG. 5). As illustrated in FIG. 7, which illustrates the cross-section along the line (the sectional line A-A) on the side of the high voltage circuit region 2A than the dividing section 6 (described in detail later), the conductor a6 provided on the side of the high voltage circuit region 2A in the capacitively coupled field plate section 20A is electrically connected to the high potential side main electrode 23, which is electrically connected to the first semiconductor region 2 in the high voltage circuit region 2A. Note that in FIG. 2 and etc., the second conductivity type (N-type) semiconductor region provided in the first semiconductor region 2, which is, the semiconductor region 15 in the high voltage circuit region 2A, is electrically connected to the high potential side main electrode 23. Referring to the section 20A of the capacitively coupled field plate 20 that is provided on the side of the high voltage circuit region 2A than the dividing section 6 (see, for example, FIG. 7), the outermost conductor a1 in the capacitively coupled field plate section 20A is electrically connected to the low potential side main electrode 22, which is electrically connected to a reference potential outside the RESURF region 11 (the semiconductor substrate 1 or the first conductive type semiconductor region 14 having substantially the same potential as the semiconductor substrate 1). Also, as illustrated in FIG. 8, which illustrates the cross-sectional view along the sectional line (the D-D sectional line) on a side of the transistor element region (LDMOS) 2B side than the dividing section 6, the conductor c6 provided on the high potential side in the capacitively coupled field plate section 20B is electrically connected to the high voltage side main electrode 27. To the contrary, as illustrated in FIG. 8, which illustrates the cross-section along the line (the D-D sectional line) on the side of the transistor element region (LDMOS) 2B than the dividing section 6, the conductor c1 provided on the low potential side in the capacitively coupled field plate section 20B is electrically connected to the control electrode 26.

Note that the "plural lines" indicate plural lines of the conductors a1 to a6 that form the first conductor group P1, plural lines of the conductors b1 to b5 that form the second conductor group P2, plural lines of the conductors c1 to c6 that form the first conductor group P1, and/or plural lines of the conductors d1 to d5 that form the second conductor group P2 (see FIG. 7 and FIG. 8). As illustrated in FIGS. 7 and 8, the capacitively coupled field plate 20 (20A, 20B) includes the first conductor group P1 and the second conductor group P2, which includes the plural conductor lines being spaced apart from one another so as to be capacitively coupled, wherein the first conductor group P1 and the second conductor group P2 are arranged (stacked) in the thickness direction of the semiconductor device as two layers. The capacitively coupled field plate 20 (20A, 20B) (i.e., the conductor groups) may be formed of one layer or multiple layers. As the conductor, a known material can be used and a typical example is polycrystalline silicon (polysilicon).

The conductors of the capacitively coupled field plate section 20A, which surrounds the outer circumference side of the high voltage circuit region 2A, are configured such that a circumferential length of the conductor line on the inner side (e.g., the conductor a6) are different from that of the conductor line on the outer side (e.g., the conductor a1). The facing area of each conductor line to an adjacent conductor line may be different from another, that is, the thickness (height) of each conductor may be different from that of another, for example, the thicknesses (height) of the conductor on the inner side (e.g., the conductor a6) may be different from that of the conductor on the outer side (e.g., the conductor a1). Further, in the case where the two conductor groups are provided at different heights from each other as two layers, an overlapping area of opposing conductors in each conductor group may be different between the inner side and the outer side. For example, the overlap of the opposing conductors may be gradually reduced from the inner side (e.g., the opposing conductors a6 and b5 provided on the inner side) to the outer side (e.g., the opposing conductors a1 and b1 provided on the outer side). Such a configuration can reduce the difference between the capacitance produced by the overlap of the adjacent conductors on the inner side in the conductor group and the capacitance produced by the overlap of the adjacent conductors on the outer side in the conductor group.

(Dividing Section)

Next, the dividing section 6 that divides the conductors in the capacitively coupled field plate 20 (20A, 20B) is described below. The dividing section 6 is provided in the conductor groups provided at the different heights as the two layers. Each of at least one conductor line in the first conductor group and at least one conductor line in the second conductor group adjacent to any one of the conductors in the first conductor group is divided by the dividing section 6 to make them discontinuous. The semiconductor device according to one or more embodiments may be characterized to include the dividing section that breaks up at least one of the plural lines of conductors in the capacitively coupled field plate 20 (20A, 20B) to make the at least one conductor line discontinuous. FIG. 3 illustrates the B-B cross sectional view of FIG. 1, illustrating a cross section along the line (the B-B line) extending along the dividing section 6 of the capacitively coupled field plate 20 (20A, 20B). The dividing section 6 is a region or an area that divides at least one of the plural conductor lines in the capacitively coupled field plate 20 (20A, 20B) to make the at least one conductor line discontinuous, such that no conductor is present in the dividing section 6.

Here, an example of a relationship between "a conductor in the second conductor group and a conductor in the first conductor group adjacent to the conductor in the first conductor group" includes a relationship between the conductor a1 and the conductor b1, a relationship between the conductor a3 and the conductor b2 or b3, and the like, among the conductors a1 to a6 of the first conductor group P1 and the conductors b1 to b5 of the second conductor group P2 provided at the height different from that of the first conductor group P1 in the thickness direction. In other words, for example, the conductor a1 and any one of the conductors b3 to b6 are not "adjacent" to each other.

With this dividing section 6, the inversion of the conductivity type on the surface of the isolation region 4 is suppressed, and thus the leakage current from the high voltage circuit region 2A to the transistor element region (LDMOS) 2B is suppressed.

It may be sufficient if at least one conductor line in the first conductor group and at least one conductor line in the second conductor group include the dividing section 6. The position of the dividing section 6 is not particularly limited. As examples of the position where the dividing section 6 is provided, later-described first to fourth examples can be applied.

Figure 9:
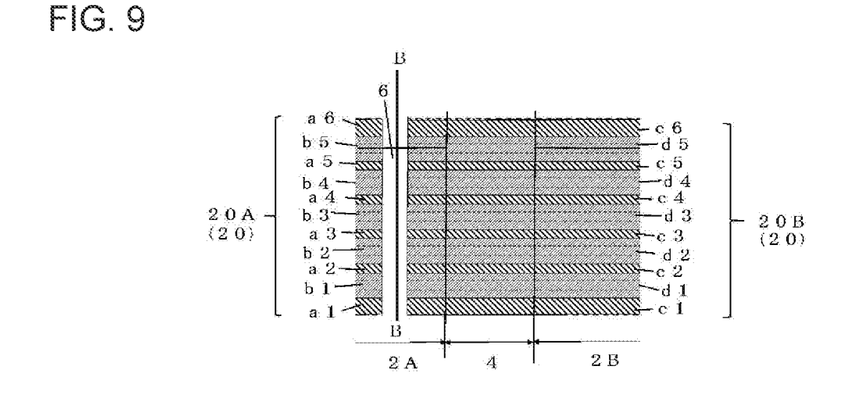
FIG. 9 is a schematic diagram (an enlarged plan view of a vicinity of an isolation region 4) illustrating a positional relationship between the isolation region 4 and a dividing section 6 of the field plate 20 of the semiconductor device 10 according to an embodiment.
Figure 10:
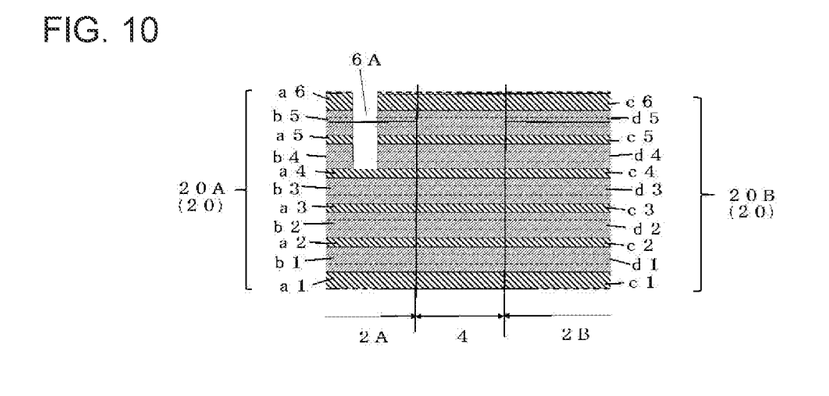
FIG. 10 is a schematic diagram (an enlarged plan view of the vicinity of the isolation region 4) illustrating a positional relationship between the isolation region 4 and a dividing section 6A of the field plate 20 of the semiconductor device 10 according to Modification 1.
Figure 11:
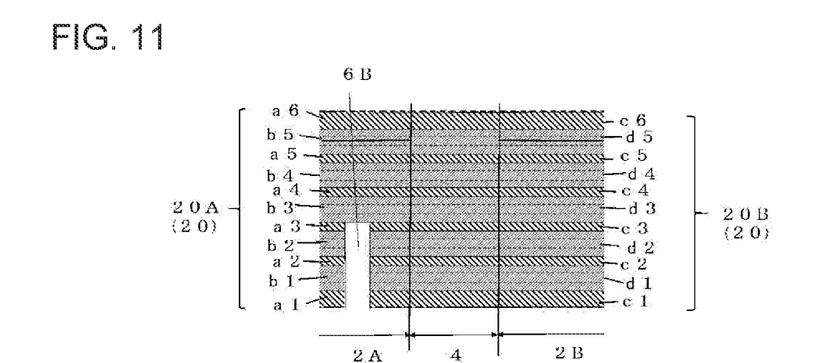
FIG. 11 is a schematic diagram (an enlarged plan view of the vicinity of the isolation region 4) illustrating a positional relationship between the isolation region 4 and a dividing section 6B of the field plate 20 of the semiconductor device 10 according to Modification 2.
Figure 12:
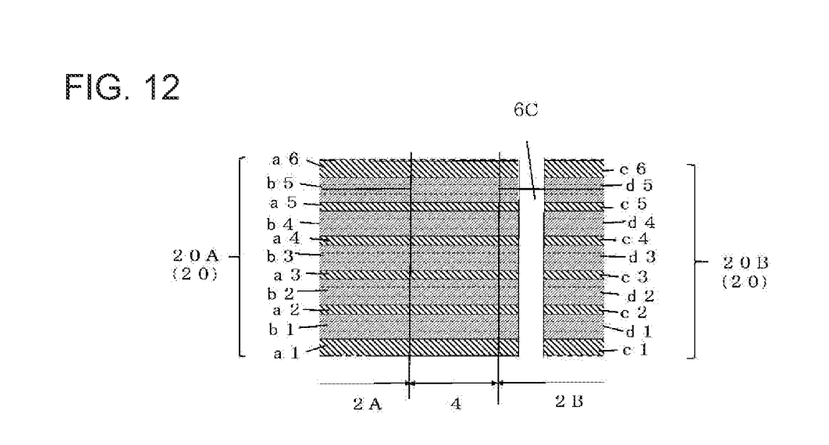
FIG. 12 is a schematic diagram (an enlarged plan view of the vicinity of the isolation region 4) illustrating a positional relationship between the isolation region 4 and a dividing section 6C of the field plate 20 of the semiconductor device 10 according to Modification 3.
Figure 13:
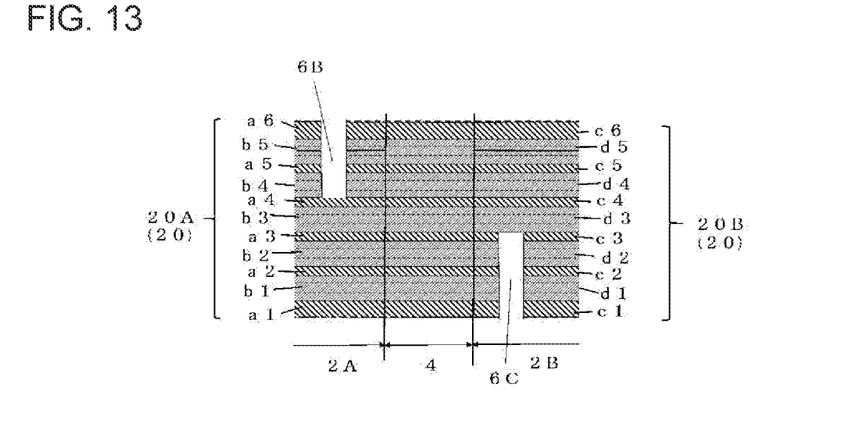
FIG. 13 is a schematic diagram (an enlarged plan view of the vicinity of the isolation region 4) illustrating a positional relationship between the isolation region 4 and dividing sections 6B and 6C of the field plate 20 of the semiconductor device 10 according to Modification 4.
Figure 14:
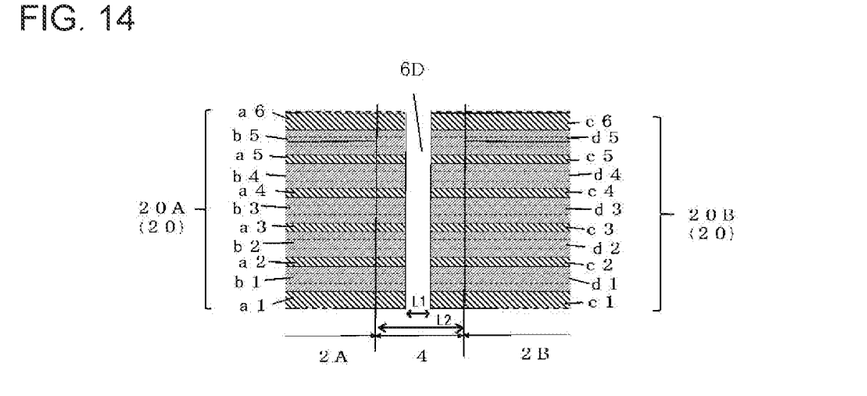
FIG. 14 is a schematic diagram (an enlarged plan view of the vicinity of the isolation region 4) illustrating a positional relationship between the isolation region 4 and a dividing section 6D of the field plate 20 of the semiconductor device 10 according to Modification 5.
Figure 15:
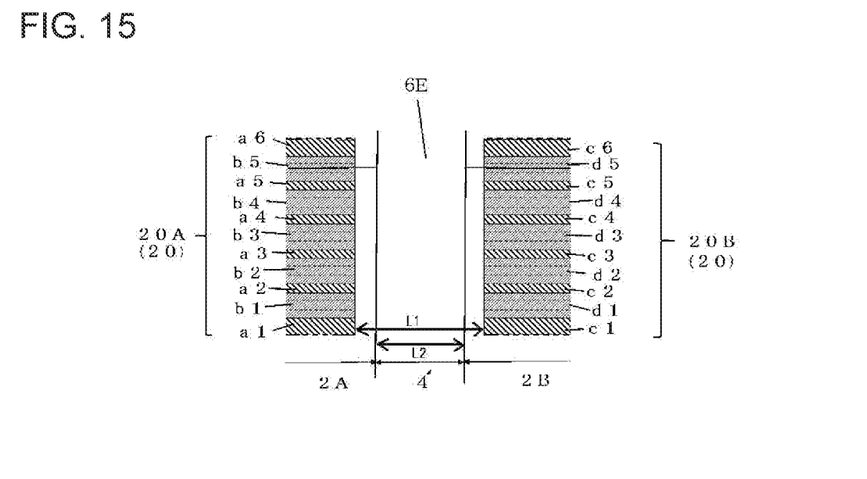
FIG. 15 is a schematic diagram (an enlarged plan view of the vicinity of the isolation region 4) illustrating a positional relationship between the isolation region 4 and a dividing section 6E of the field plate 20 of the semiconductor device 10 according to Modification 6.

As illustrated in FIGS. 9 to 11, the dividing section (6, 6A, 6B) may be provided on the side of the high voltage circuit region 2A than the separation region 4. As illustrated in FIG. 12, the division (6C) may be provided on the side of the transistor element region (LDMOS) 2B than the separation region 4. As illustrated in FIG. 13, the dividing sections (6B and 6C) may be provided on the side of the high voltage circuit region 2A than the separation region 4 and on the side of the transistor element regions (LDMOS) 2B than the separation region 4, respectively. As illustrated in FIGS. 14 and 15, the dividing section (6D) may be provided on the isolation region 4. The dividing section is described in more detail below.

As first examples of the position of the dividing section 6, as illustrated in FIGS. 9 to 11, the dividing section may be positioned on the side of the high voltage circuit region 2A (the left side in FIGS. 9 to 11) than the isolation region 4, in the plan view of the semiconductor device. In such a structure, a portion of the capacitively coupled field plate on the isolation region 4 is the capacitively coupled field plate section 20B, and thus the potential distribution on the surface of the isolation region 4 is based on the capacitively coupled field plate section 20B on the high voltage circuit region 2A side, but not based on the capacitively coupled field plate section 20A on the transistor element regions (LDMOS) 2 side. As a result, affects of the potential fluctuations under the field plate when the potentials of the high voltage circuit region and the transistor element region which are opposed to each other across the separation region are different from each other can be reduced more effectively. Therefore, leakage current from the high voltage circuit region 2A to the transistor element region 2B and the isolation region 4 can be more effectively suppressed.

In FIG. 9, as seen in the plan view of the capacitively coupled field plate, the dividing section 6 is arranged on the high voltage circuit region 2A side with respect to the isolation region 4, such that by the dividing section 6, the conductors a1 to a6 of the capacitively coupled field plate section 20A on the high voltage circuit region 2A side are separated from the conductors c1 to c6 of the capacitively coupled field plate section 20B on the transistor element 2B side, and the conductors b1 to b5 of the capacitively coupled field plate section 20A on the high voltage circuit region 2A side are separated from the conductors d1 to d5 of the capacitively coupled field plate section 20B on the transistor element 2B side.

FIG. 10 illustrates an example (Modification 1) in which, in the plan view of the semiconductor device, a dividing section 6A is provided only on the high potential side in the field plate 20 such that, by the dividing section 6A, the conductors a5 to a6 provided on the high potential side in the capacitively coupled field plate section 20A are divided from the conductor c5 to c6 in the capacitively coupled field plate section 20B, and the conductors b4 to b5 provided on the high potential side in the capacitively coupled field plate section 20A are divided from the conductors d4 to d5 in the capacitively coupled field plate section 20B. The conductors a1 to a4 on the low potential side and the conductors c1 to c4 on the low potential side are not separated by the dividing section and thus connected to each other. That is, the conductor lines a1 to a4 on the high voltage circuit region 2A side are connected to and continuous with the conductor lines c1 to c4 on the transistor element region 2B which are adjacent to the conductor lines a1 to a4. Similarly, the conductors b1 to b3 on the low potential side and conductors d1 to d3 on the low potential side are not separated by the dividing section and thus connected to each other. That is, the conductor lines b1 to b3 on the high voltage circuit region 2A side are connected to and continuous to the conductor lines d1 to d3 on the transistor element region 2B which are adjacent to the conductor lines b1 to b3.

FIG. 11 illustrates an example (Modification 2) in which, in the plan view of the semiconductor device, a dividing section 6B is provided only on the low-potential side in the field plate 20 such that, by the dividing section 6B, the conductor a1 to a3 on the low potential side in the capacitively coupled field plate section 20A are divided from the conductors c1 to c3 in the capacitively coupled field plate section 20B, and the conductors b1 to b2 on the low potential side in the capacitively coupled field plate section 20A are divided from the conductors d1 to d2 in the capacitively coupled field plate section 20B. In this Modification 2, the conductors a4 to a6 and the conductors c4 to c6 on the high potential side are not separated from each other by the dividing section 6B, and thus connected to each other. That is, the conductor lines a4 to a6 on the high voltage circuit region 2A side are connected to and continuous with the conductor lines c4 to c6 on the transistor element regions 2B which are adjacent to the conductor lines a4 to a6. Similarly, the conductors b3 to b5 and the conductors d3 to d5 on the high potential side are not separated by the dividing section 6B, and thus connected to each other. That is, the conductor lines b3 to b5 on the high voltage circuit region 2A side are connected to and continuous with the conductor lines d3 to d5 on the transistor element regions 2B which are adjacent to the conductor lines b3 to b5.

As a second example of the position of the dividing section, as illustrated in FIG. 12 (Modification 3), a dividing section 6C may be provided on the side of the transistor element (LDMOS) 2B with respect to the isolation region 4 in the plan view of the semiconductor device. As seen in the plan view of the capacitively coupled field plate, by the dividing section 6 located on the side of the transistor element (LDMOS) 2b with respect to the isolation region 4, the conductors a1 to a6 of the capacitively coupled field plate section 20A are divided from the conductors c1 to c6 of the capacitively coupled field plate section 20B and the conductors b1 to b5 of the capacitively coupled field plate section 20A are divided from the conductors d1 to d5 of the capacitively coupled field plate section 20B. In this case, the surface of the isolation region 4 is more affected by the potential distribution of a portion of the capacitively coupled field plate section 20A on the high voltage circuit region 2A side, that is provided above the isolation region 4.

As illustrated in FIG. 4 and FIG. 6, the RESURF region 11 adjacent to the second semiconductor region 7 is not formed in the isolation region 4, and thus the depletion layer is less likely to extend to the isolation region 4, and the electric field in and around the isolation region 4 becomes stronger. In particular, it is difficult to deplete in the low-potential side (the low voltage circuit region 5 side, which is the left side in FIG. 4) of the isolation region 4, so that potential differences between the surface of the isolation region 4 and the capacitively coupled filed field plate 20 (20A, 20B) provided above the isolation region 4 are more likely to occur. As illustrated in FIG. 9, in the case where the dividing section 6 is provided on the high voltage circuit region 2A side with respect to the isolation region 4, the potential difference between the control electrode (e.g., the gate electrode) or the low voltage side main electrode (e.g., the source electrode) of the transistor element region (LDMOS) 2B and the first conductor line c1 in the coupled field plate section 20B (the first conductor line c1 from the low-potential side) increases. Thus, leak current flows through the insulation film between the control electrode or the low voltage side electrode and the first conductor line c1, which thereby causes the first conductor line c1 to be charged with electrons. With this, the surface concentration of the semiconductor of the transistor element regions (LDMOS) 2B under the capacitively coupled field plate 20 (20A, 20B) drops, which may arise a problem that the on-resistance of the transistor element region (LDMOS) 2B increases.

In light of this, the structure may be configured, like Modification 4 described later illustrated in FIGS. 12 and 13, in which at least a part of the dividing section is arranged on the transistor element region (LDMOS) 2B side, particularly on the low potential side of the capacitively coupled field plate, so that a portion of the field plate above the low potential side of the dividing section is the capacitively coupled field plate section 20A extending from the high voltage circuit region 2A. Therefore, the above identified problem is unlikely to occur to the capacitively coupled field plate section 20B. That is, it is possible to suppress increase of the ON resistance of the transistor element regions (LDMOS) 2B, in addition to suppressing the leakage current from the high voltage circuit region (HVDi).

As a third example of the location of the dividing section, as illustrated in FIG. 13 (Modification 4), the capacitively coupled field plate 20 (20A, 20B) may be configured to include, in the plan view, at least one conductor line including a dividing section 6B that is located on the high voltage circuit region 2A side with respect to the isolation region 4 and at least one conductor line including a dividing section 6C that is located on the transistor element region 2B side with respect to the isolation region 4. As illustrated in FIG. 13, in the plan view of the capacitively-coupled field plate 20, the diving section 6B located on the high voltage circuit region 2A side with respect to the isolation region 4 divides the conductors a5 and a6 from the conductors c5 and c6, and the conductors b4, b5, and b6 from the conductors d4, d5, and d6. The dividing section 6C located on the transistor element region 2B side with respect to the isolation region 4 divides the conductors a1, a2, and a3 from the conductors c1, c2, and c3 and the conductors b1 and b2 from the conductors d1 and d2. In other words, the dividing section 6B provided on the high potential side is located on the high voltage circuit region 2A side with respect to the isolation region 4, and the dividing section 6C provided on the low potential side is located on the transistor element regions (LDMOS) 2B side with respect to the isolation region 4. In this case, a portion of the capacitively coupled field plate on the isolation region 4 comprises the capacitively coupled field plate section 20B on the high potential side and the capacitively coupled field plate section 20A on the low potential side. Here, regarding to the length of the dividing section (in the vertical direction in FIG. 13), it is preferable that the dividing section 6B is larger than the dividing section 6C. In such a semiconductor device, it is possible to suppress increase of the ON resistance of the transistor element regions (LDMOS) 2B, in addition to suppressing the leakage current from the high voltage circuit region (HVDi). Note that, contrary to FIG. 13, the dividing section 6B provided on the high potential side of the capacitively coupled field plate may be provided on the transistor element region (LDMOS) 2B side with respect to the isolation region 4 and the dividing section 6C provided on the low potential side of the capacitively coupled field plate may be provided on the high voltage circuit region 2A side with respect to the isolation region 4. Even in such a semiconductor device, the leakage current from the high voltage circuit region (HVDi) can be suppressed.

Furthermore, as a fourth example of the location of the dividing section of the capacitively coupled field plate, as illustrated in FIG. 14 (Modification 5), a dividing section 6C may be located above the isolation region 4 so as to overlap with the isolation region 4 in the plan view of the semiconductor device. In such a configuration, it is possible to suppress the leak current from the high voltage circuit region 2A to the transistor element region (LDMOS) 2B and the isolation region 4 more effectively.

As described in FIGS. 9, 12, and 14, it is preferable that all of the plural conductor lines in the capacitively coupled field plate are divided to be discontinuous by the dividing section. However, it may be sufficient if at least one of the plural conductor lines is divided to be disputatious by a dividing section. In other words, at least one of the plural conductor lines may not be divided by a dividing section so as to be continuous. It may also be in the form of a combination of any of the first four examples described above. Regardless of whether all or only a part of the plural conductor lines are divided, the dividing section may be located on either the high potential side of the capacitively coupled field plate or the low potential side of the capacitively coupled field plate. Further, the dividing sections may be separately provided on the high potential side of the capacitively coupled field plate and on the low potential side of the capacitively coupled field plate, respectively.

In the plan view of the semiconductor device, a width (L1 in FIG. 14) of a dividing section 6D of the capacitively coupled field plate is smaller than or equal to a width (L2 in FIG. 14) of the isolation region 4. Even with this division 6D, the field plate effect and the leakage current suppression effect can be obtained in a stable manner. Note that, as illustrated in FIG. 15 (Modification 6), a width (L1 in FIG. 15) of a dividing section 6E dividing the capacitively coupled field plate may be larger than the width (L2 in FIG. 15) of the isolation region 4. Even with this dividing section 6E, the field plate effect and the leakage current suppression effect can be obtained in a stable manner.

Figure 16:
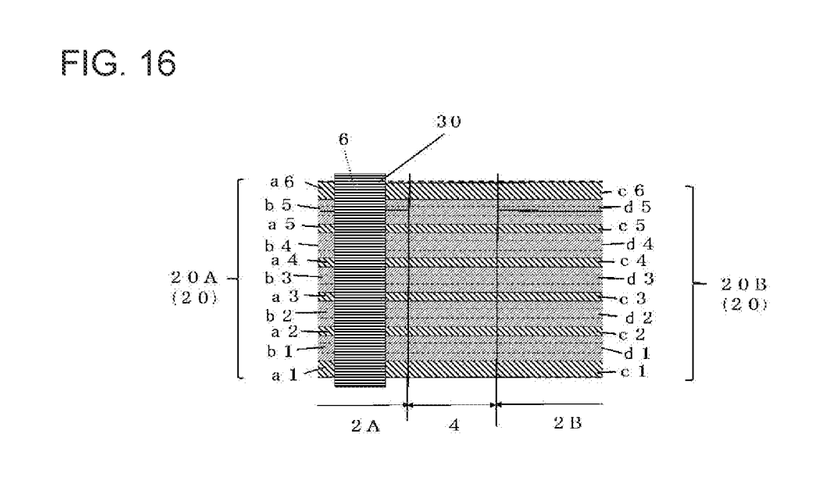
FIG. 16 is a schematic diagram (an enlarged plan view of the vicinity of the isolation region 4) illustrating a positional relationship between the isolation region 4 and a dividing section 6 of the field plate 20 of the semiconductor device 10 according to Modification 7.
Figure 17:
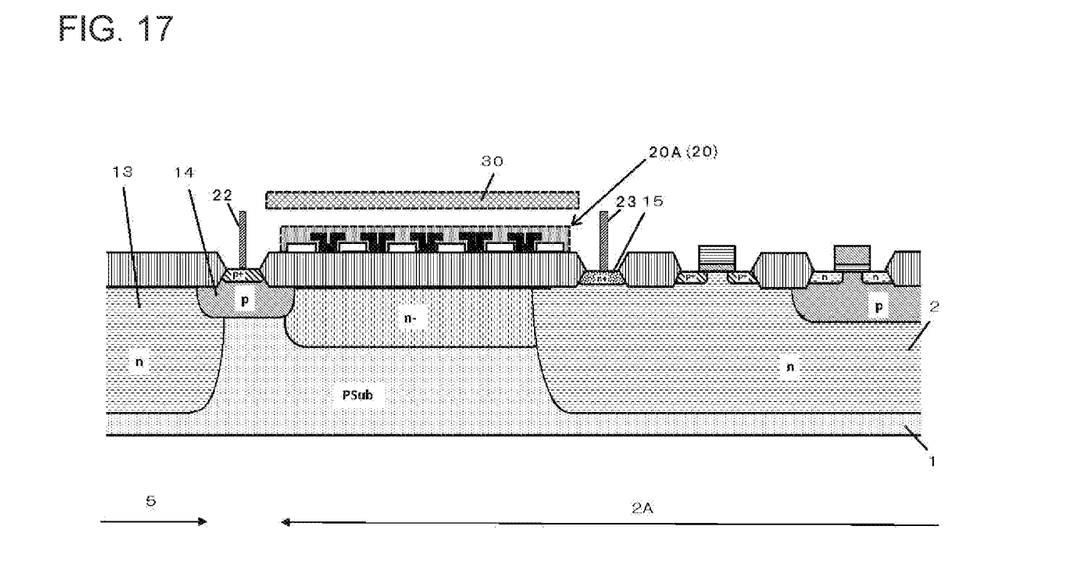
FIG. 17 is a diagram illustrating a cross-sectional view of the semiconductor device 10 according to Modification 7 illustrated in FIG. 16, taken along the dividing section 6 of the field plate.

Also, as illustrated in FIGS. 16 and 17 (Modification 7), it is preferable that a shield electrode 30 (floating metal) is provided on the dividing section 6. FIG. 16 illustrates the semiconductor device with the shield electrode 30 added to the semiconductor device illustrated in the plan view of FIG. 9. FIG. 17 illustrates a cross-sectional view taken along the dividing section 6 illustrated in FIG. 16, with a dotted line surrounding the capacitively coupled field plate section 20A for explaining the positional relationship in height. By providing the shield electrode 30 above the dividing section 6, it is possible to suppress the exposure of the semiconductor surface due to the dividing section 6 and suppress the influence of external ions invading from the outside of the semiconductor device.

(Low Voltage Circuit Region)

The semiconductor device according to an embodiment may further comprise a low voltage circuit region 5 (see FIG. 1, etc.). The semiconductor device according to an embodiment described above is particularly effective in such a configuration.

(RESURF Region)

In the semiconductor device according to an embodiment, the RESURF region 11 may be provided on the outer periphery side of the high voltage circuit region 2A in the plan view of the semiconductor device. In addition, the RESURF region 12 may be provided between the control electrode 26 and the high voltage side electrode 27 of the transistor element regions (LDMOS) 2B in the plan view of the semiconductor device.

The invention is not limited to one or more embodiments or modifications described above. The above described one or more embodiments and modifications are examples, and any embodiment or modification that has substantially the same configuration as the technical concept described in the claims of the invention and may achieve the same or similar effects is included in the technical scope of the invention.

The invention claimed is:

1. A semiconductor device comprising: on a semiconductor substrate, a high voltage circuit region; a transistor element region; an isolation region that elementally isolates the transistor element region from the high voltage circuit region; and a capacitively coupled field plate including plural lines of conductors, wherein
    the capacitively coupled field plate is provided to extend circumferentially along an outer circumferential portion of the high voltage circuit region and across the transistor element region, in a plan view of the semiconductor device, and
    one or more dividing sections divides at least one of the plural lines of conductors in the capacitively coupled field plate to make the at least one of the plural lines discontinuous.

2. The semiconductor device according to claim 1, wherein
    in the plan view of the semiconductor device, the one or more dividing sections is provided on a side of the high voltage circuit region with respect to the isolation region.

3. The semiconductor device according to claim 1, wherein
    in the plan view of the semiconductor device, the one or more dividing sections is provided on a side of the transistor element region with respect to the isolation region.

4. The semiconductor device according to claim 1, wherein
    the capacitively coupled field plate includes:
    at least one of the plural lines of conductors including a first dividing section of the one or more diving sections that is disposed on a side of the high voltage circuit region with respect to the isolation region in the plan view of the semiconductor device; and
    at least one of the plural lines of conductors including a second dividing section of the one or more dividing sections that is disposed on a side of the transistor element region with respect to the isolation region in the plan view of the semiconductor device.

5. The semiconductor device according to claim 1, wherein
    the one or more dividing sections is arranged to overlap with the isolation region in the plan view of the semiconductor device.

6. The semiconductor device according to claim 1, further comprising
    a shield electrode provided on the one or more dividing sections.

7. The semiconductor device according to claim 1, wherein
    the capacitively coupled field plate includes the one or more dividing sections that divides all of the plural lines of conductors.

8. The semiconductor device according to claim 1, wherein
    a RESURF region is located around the high voltage circuit region in the plan view of the semiconductor device.

9. The semiconductor device according to claim 8, wherein in the plan view of the semiconductor device, the RESURF region is not located in an area between the high voltage circuit region and the transistor element region.

10. The semiconductor device according to claim 1, wherein
in the plan view of the semiconductor device, a width of each of the one or more dividing sections is not greater than a width of the isolation region.

11. The semiconductor device according to claim 1, further comprising
a low voltage circuit region.

12. The semiconductor device according to claim 1, wherein
the semiconductor substrate has a first conductivity type,
the high voltage circuit region is located in a first semiconductor region of a second conductivity type on the semiconductor substrate,
the transistor element region includes: on the semiconductor substrate, a high voltage side main electrode on a second semiconductor region of the second conductivity type that is separated from the first semiconductor region; a low voltage side main electrode; and a control electrode provided between the high voltage side main electrode and the low voltage side main electrode,
the isolation region is a semiconductor region of the first conductivity type,
the capacitively coupled field plate includes: a first conductor group overlapping with a part of an outer edge of the high voltage circuit region in the plan view of the semiconductor device and including plural lines of conductors being separated from each other and capacitively coupled to each other; and a second conductor group arranged between the control electrode and the high voltage side main electrode of the transistor element region and including plural lines of conductors being separated from each other and capacitively coupled to each other,
one end of the first conductor group is electrically connected to the first semiconductor region, and the other end of the first conductor group is electrically connected to a third semiconductor region of the first conductive type, which is electrically connected to the semiconductor substrate,
one end of the second conductor group is electrically connected to the high voltage side main electrode, and the other end of the second conductor group is electrically connected to the control electrode or the low voltage side main electrode, and
the one or more dividing sections divides one or more of the plural lines of conductors of the first conductor group and one or more of the plural lines of conductors of the second conductor group that are adjacent to the one or more of the plural lines of conductors of the first conductor group.

\* \* \* \* \*